United States Patent [19]

Usami

[11] Patent Number: 5,503,678
[45] Date of Patent: Apr. 2, 1996

[54] VERTICAL LOW PRESSURE CVD APPARATUS WITH AN ADJUSTABLE NOZZLE

[75] Inventor: Tatsuya Usami, Tokyo, Japan

[73] Assignee: NEC Corporation, Tokyo, Japan

[21] Appl. No.: 334,303

[22] Filed: Nov. 4, 1994

[30] Foreign Application Priority Data

Nov. 4, 1993 [JP] Japan .................. 5-275344

[51] Int. Cl.⁶ ............................................ C23C 16/00
[52] U.S. Cl. ........................ 118/724; 118/715; 118/725
[58] Field of Search ............................ 118/715, 724, 118/725

[56] References Cited

U.S. PATENT DOCUMENTS

| | | | |
|---|---|---|---|
| 4,817,558 | 4/1989 | Itoh | 118/725 |
| 5,029,554 | 7/1991 | Miyashita | 118/715 |
| 5,127,365 | 7/1992 | Koyama | 118/724 |
| 5,320,680 | 6/1994 | Learn | 118/724 |

FOREIGN PATENT DOCUMENTS

| | | | |
|---|---|---|---|
| 1-73930 | 5/1989 | Japan . | |
| 1-161719 | 6/1989 | Japan | 118/724 |
| 4-332122 | 11/1992 | Japan | 118/724 |
| 5-144746 | 6/1993 | Japan | 118/724 |

Primary Examiner—R. Bruce Breneman
Assistant Examiner—Jeffrie R. Lund
Attorney, Agent, or Firm—Sughrue, Mion, Zinn, Macpeak & Seas

[57] ABSTRACT

A vertical low pressure CVD (Chemical Vapor Deposition) apparatus includes a first and a second annular nozzle assigned to silane gas and an oxidizing gas, respectively. The first nozzle adjoins the lowermost portion of a boat loaded with a stack of wafers. The two nozzles are spaced from each other and have a plurality of holes arranged in a similar fashion. The oxidizing gas, jetted from the second nozzle, reaches the first nozzle over the same distance and, therefore, in the same amount as measured around the first nozzle. As a result, the two kinds of gas are mixed in a uniform ratio. The distance between the two nozzles may be changed for different types of oxidizing gases to uniformly mix the oxidizing gas with the silane gas without an early reaction.

4 Claims, 2 Drawing Sheets

VERTICAL LOW PRESSURE CVD APPARATUS WITH AN ADJUSTABLE NOZZLE

BACKGROUND OF THE INVENTION

The present invention relates to a vertical low pressure CVD (Chemical Vapor Deposition) apparatus for effecting vapor phase epitaxy on semiconductor substrates or wafers.

A vertical low pressure CVD, or sometimes abbreviated as LPCVD, apparatus is disclosed in, for example, Japanese Laid-Open Publication No. 1-73930. This kind of conventional CVD apparatus forms films on wafers by using monosilane gas and oxygen gas as reactive gas. In the conventional CVD apparatus, an annular nozzle formed with holes for jetting monosilane gas is disposed remote from the oxygen inlet port, so that the monosilane gas is prevented from reacting with the oxygen gas, which is highly oxidizing, at an early stage. Moreover, the oxygen gas inlet port is formed through only one portion of a flange which is connected to the bottom of an outer tube. When the pressure inside the CVD apparatus is below 1 Torr, the molecules of gas flow in a transitional range between a viscous flow range and a molecular flow range, as is well known in the art. Hence, the diffusion of oxygen molecules jetted from the oxygen gas port and flowing toward the annular nozzle is caused to change by the circumference of the annular nozzle. As a result, the mixture of monosilane gas and oxygen and, therefore, the reaction of the two kinds of gas becomes irregular. Specifically, in a region where the monosilane concentration is high, the two kinds of gas react excessively and roughen the surfaces of the wafers. Conversely, in a region where the monosilane concentration is low, the reaction is short and reduces the thickness of the resulting films.

SUMMARY OF THE INVENTION

It is, therefore, an object of the present invention to provide a vertical low pressure CVD apparatus capable of mixing various kinds of gas to react in a uniform ratio and thereby forming uniform films on wafers.

A vertical low pressure CVD apparatus of the present invention has a boat loaded with a stack of wafers, a heat insulation tube holding the boat, an inner tube surrounding the boat, an outer tube surrounding the inner tube and having a flange which supports the inner tube on the inner periphery thereof and is formed with an opening at the bottom thereof for the entry of the boat, a heater surrounding the outer tube, a first annular nozzle surrounding a bottom portion of the boat and formed with a plurality of holes at spaced locations along the circumference thereof for jetting first reactive gas, and a second annular nozzle disposed below the first nozzle and formed with a plurality of holes at spaced locations along the circumference thereof for jetting second reactive gas.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
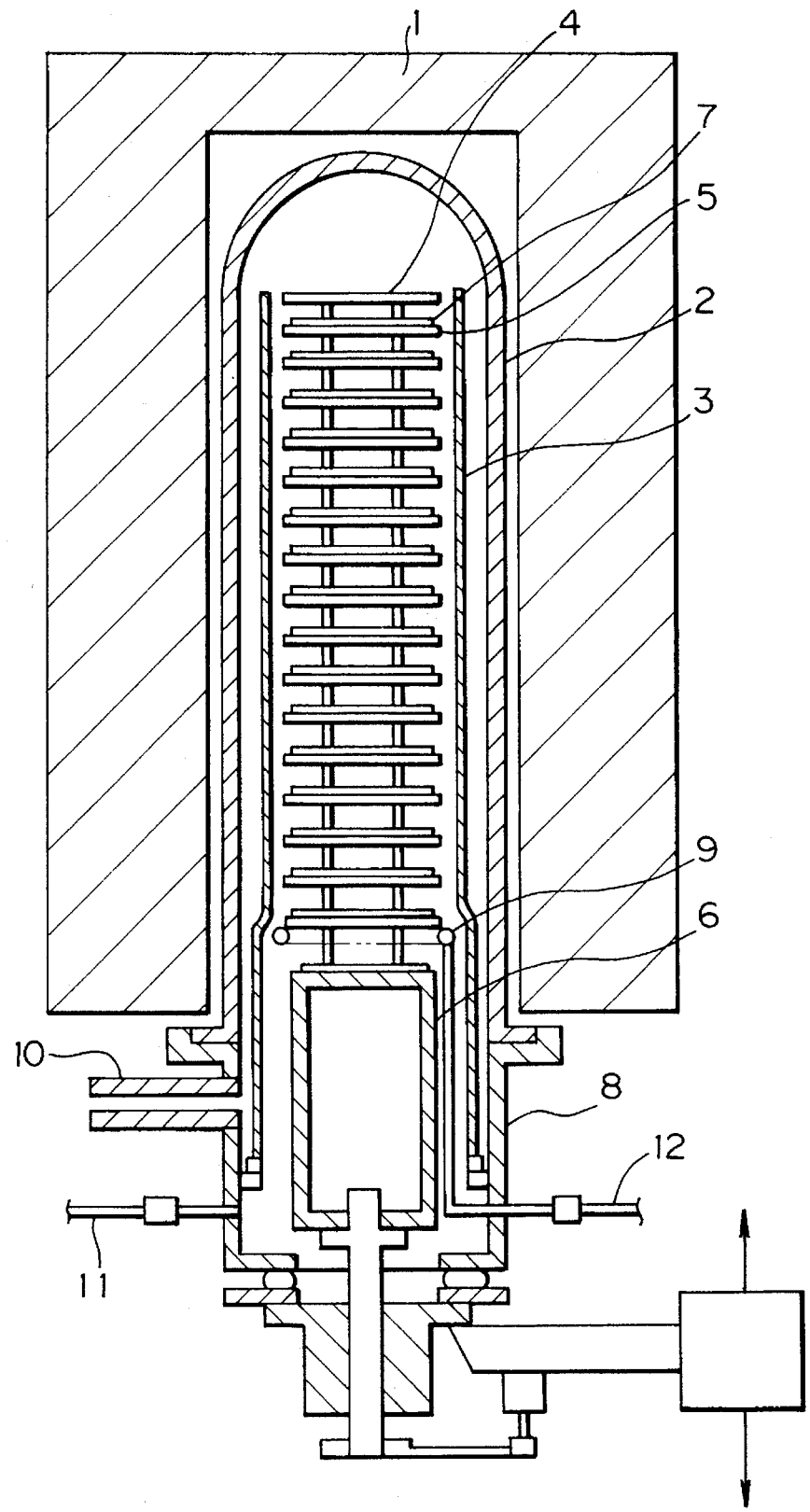
FIG. 1 is a section showing a conventional vertical low pressure CVD apparatus.

To better understand the present invention, a brief reference will be made to a conventional vertical LPCVD apparatus, shown in FIG. 1. The CVD apparatus to be described is of the type taught in, for example, previously mentioned Japanese Utility Model Laid-Open Publication No. 1-73930. As shown, the CVD apparatus has a boat 4 supporting a stack of holders 5. A plurality of semiconductor substrates or wafers 7 are each laid on one of the holders 5. The boat 4 is surrounded by an inner tube 3 and retained by a heat insulation tube 6. An outer tube 2 surrounds the inner tube 3 and has a flange 8 which is formed with an opening at the bottom thereof for the entry of the boat 4 into the inner tube 3. The inner tube 3 is mounted on the inner periphery of the flange 8. Further, the outer tube 2 is surrounded by a heater 1.

Means for jetting gas into the CVD apparatus includes an annular nozzle 9 adjoining the lowermost holder 5 of the boat 4 and formed with a number of jet holes. Monosilane gas under pressure is fed to the nozzle 9 via a gas inlet port 12. An oxygen inlet port 11 is formed through the flange 8 of the outer tube 2. In this configuration, as monosilane gas from the nozzle 9 and oxygen gas from the oxygen inlet port 11 are fed into the inner tube 3, they react with each other to form films on the wafers 7 At the same time, non-reacted part of the gas is discharged via the passageway between the inner tube 3 and the outer tube 2 and an exhaust port 10.

With the conventional apparatus described above, it is possible to load and unload the apparatus with the wafers 7 by moving the boat 4 up and down since the annular nozzle 9 adjoins the bottom of the boat 4 and since the gas inlet port 12 is provided in the flange 8. Therefore, it is not necessary for the gas inlet port to be implemented by a flexible tube or for the nozzle 9 and boat 4 to be joined by an automatic connecting mechanism. As a result, dust in the form of flakes are prevented from being produced in the reacted gas mixture. Further, the lower portion of the inner tube 3 is flared so as not to contact the nozzle 9 or the boat 4 and is spaced a predetermined distance from the holders 5 of the boat 4. This allows uniform films to grow on the wafers 7.

However, the problem with the conventional apparatus is that the annular nozzle 9 for jetting monosilane gas and the oxygen inlet port 11 are remote from each other. In this condition, oxygen molecules jetted from the gas inlet port 11 are caused to diffuse in different ways by the circumference of the nozzle 9, preventing the oxygen gas from being uniformly mixed with the monosilane gas. This causes the two different kinds of gas to react irregularly. Specifically, in a region where the monosilane concentration is low, the two kinds of gas react with each other excessively and roughen the surfaces of the wafers. Conversely, in a region where the monosilane concentration is low, the reaction is short and reduces the thickness of the resulting films.

Figure 2:
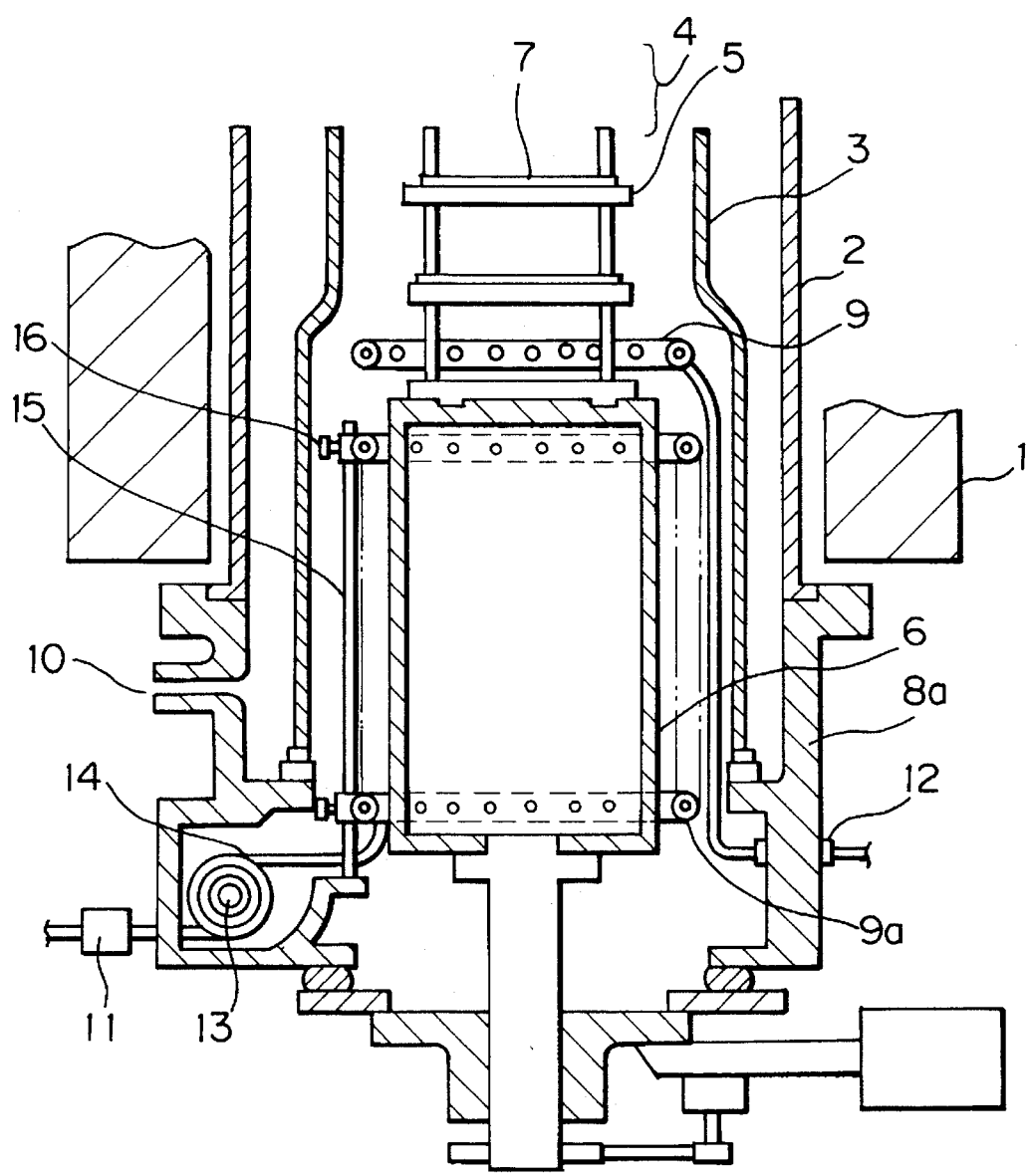
FIG. 2 is a section showing a vertical low pressure CVD apparatus embodying the present invention.

Referring to FIG. 2, a vertical LPCVD apparatus embodying the present invention is shown. In the embodiment, the same or similar constituent parts as or to the parts of the conventional apparatus are designated by the same reference numerals, and a detailed description thereof will not be made in order to avoid redundancy. As shown, the apparatus has an annular nozzle 9 surrounding the bottom of a boat 4 like the conventional nozzle 9. The nozzle 9 is formed with a plurality of holes at spaced locations along the circumference thereof so as to jet monosilane gas or first gas. An annular nozzle 9a is positioned below the nozzle 9 and formed with a plurality of holes in the same configuration as the nozzle 9 so as to jet oxidized gas or second gas. The nozzle 9 has an inside diameter which is great enough to remain spaced apart from the boat 4 and a heat insulation tube 6 in the event of ingress and egress of the boat 4. The inside diameter of an inner tube 3 is also increased to prevent the tube 3 from contacting the nozzle 9. A gas inlet port 12 is communicated to the nozzle 9 by a tubing, not shown, which plays the role of a support at the same time.

The other annular nozzle 9a, assigned to oxidized gas, has substantially the same shape and dimensions as the nozzle 9 assigned to silane gas. Preferably, the nozzle 9a should be movable between an upper and a lower position on and long a heat insulation tube 6, depending on the kind of the oxidizing gas. Specifically, it is preferable that the nozzle 9a takes, when the oxidizing gas is oxygen gas which is highly oxidizing, the lower position to increase the distance between nozzles 9 and 9a, as indicated by a dash-and-dots line in the figure, or takes, when it is nitrogen oxide gas or similar gas, the upper position near the nozzle 9, as indicated by a dashed line in the figure.

The nozzle 9a may be moved between the upper and lower positions by a mechanism also shown in FIG. 2 specifically. The mechanism includes posts 15 extending from part of the inner periphery of a flange 8a. The nozzle 9a has portions at the side thereof which are respectively coupled over the posts 15, so that the nozzle 9a is slidable up and down along the posts 15. A locking mechanism 16 is operated to lock the nozzle 9a to the heat insulation tube 6 at either the upper position or the lower position, as desired. A flexible tube 14 communicates an oxidizing gas inlet port 11 to the nozzle 9a. The flexible tube 14 is wound round a reel 13 so as not to slacken and obstruct the ingress and egress of the boat 4.

In the above configuration, the nozzle 9a assigned to the oxidizing gas has the same configuration as and faces the nozzle 9 assigned to the silane gas. As a result, the entire oxidizing gas jetted from the holes of the nozzle 9a reaches the nozzle 9 over the same distance and, therefore, i n substantially the same amount as measured around the nozzle 9. The oxidizing gas is, therefore, uniformly mixed with the silane gas. The resulting uniform gaseous mixture successfully forms uniform films on the surfaces of wafers 7. Furthermore, by changing the distance between the nozzles 9 and 9a in matching relation to the kind of oxidizing gas, it is possible to prevent the two kinds of gas from reacting at an early stage. This protects the inner tube 3, heat insulation tube 6 and bottom of the boat 4 from filming which would again contaminate the wafers 7.

In summary, it will be seen that the present invention provides a vertical LPCVD apparatus in which a nozzle assigned to oxidizing gas has the same configuration as and faces a nozzle assigned to silane gas. As a result, the oxidizing gas reaches the silane gas nozzle over the same distance and, therefore, in substantially the same amount as measured around the nozzle. The oxidizing gas is, therefore, uniformly mixed with the silane gas. The resulting uniform gaseous mixture successfully forms uniform films on the surfaces of wafers. Furthermore, by changing the distance between the two nozzles, it is possible to prevent the two kinds of gas from reacting at an early stage and, therefore, allows the apparatus to operate with various kinds of reactive gas.

Various modifications will become possible for those skilled in the art after receiving the teachings of the present disclosure without departing from the scope thereof.

What is claimed is:

1. A vertical low pressure CVD (Chemical Vapor Deposition) apparatus comprising:

a boat loaded with a stack of wafers;

a heat insulation tube holding said boat;

an inner tube surrounding said boat;

an outer tube surrounding said inner tube and having a flange which supports said inner tube on an inner periphery thereof and is formed with an opening at a bottom thereof for entry of said boat;

a heater surrounding said outer tube;

a first annular nozzle surrounding a bottom portion of said boat and formed with a plurality of holes at spaced locations along a circumference thereof for jetting first reactive gas;

a second annular nozzle disposed below said first nozzle and formed with a plurality of holes at spaced locations along a circumference thereof for jetting second reactive gas; and adjusting means for adjusting a distance between said first nozzle and said second nozzle.

2. An apparatus as claimed in claim 1, wherein said adjusting means comprises;

posts extending from part of the inner periphery of said flange;

coupling portions formed on a side of said second nozzle and respectively slidably coupled over said posts; and locking means for locking said second nozzle in position.

3. An apparatus as claimed in claim 1, wherein said first nozzle and said second nozzle have a same shape and same dimensions.

4. An apparatus as claimed in claim 1, wherein said first gas and said second gas comprise monosilane gas and oxidizing gas, respectively.

\* \* \* \* \*